(12) United States Patent
Kim

(10) Patent No.: US 8,526,210 B2
(45) Date of Patent: Sep. 3, 2013

(54) SEMICONDUCTOR DEVICE WITH OTP MEMORY CELL

(75) Inventor: Tae Hoon Kim, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 95 days.

(21) Appl. No.: 13/249,524

(22) Filed: Sep. 30, 2011

(65) Prior Publication Data

US 2012/0120707 A1 May 17, 2012

(30) Foreign Application Priority Data

Nov. 17, 2010 (KR) .................. 10-2010-0114712

(51) Int. Cl.
*G11C 17/08* (2006.01)
(52) U.S. Cl.
USPC ..................................... 365/104; 365/189.05

(58) Field of Classification Search
USPC ............................................ 365/104, 189.05
See application file for complete search history.

(56) References Cited

U.S. PATENT DOCUMENTS

2010/0080035 A1* 4/2010 Venkatraman et al. ....... 365/104

FOREIGN PATENT DOCUMENTS

KR 1020050001966 A 1/2005

* cited by examiner

*Primary Examiner* — Michael Tran
(74) *Attorney, Agent, or Firm* — WIlliam Park & Associates Patent Ltd.

(57) ABSTRACT

A semiconductor device with an OTP memory cell includes a first MOS transistor having a first gate terminal connected to a first line, and a first terminal connected to a first node, a second MOS transistor having a second gate terminal connected to a second line, and a first terminal connected to the first node, and a third MOS transistor having a gate terminal connected to a three line, and a first terminal of the third MOS transistor connected to the first node.

20 Claims, 8 Drawing Sheets

< Programmed OTP cell >

< Initial OTP cell >

< Programmed OTP cell >

< Initial OTP cell >

< Programmed OTP cell >

< Program operation >

< Read operation >

US 8,526,210 B2

SEMICONDUCTOR DEVICE WITH OTP MEMORY CELL

CROSS-REFERENCE(S) TO RELATED APPLICATIONS

The present application claims priority of Korean Patent Application No. 10-2010-0114712, filed on Nov. 17, 2010, which is incorporated herein by reference in its entirety.

BACKGROUND OF THE INVENTION

Exemplary embodiments of the present invention relate to a semiconductor device, and more particularly, to a semiconductor device with a one-time programmable (OTP) memory cell.

A semiconductor memory device is a storage device which can store data and read the stored data. A semiconductor memory device may be categorized into a random access memory (RAM) and a read only memory (ROM). A ROM is a nonvolatile memory device which retains data even when power is interrupted. Examples of the ROM include a programmable ROM (PROM), an erasable PROM (EPROM), an electrically EPROM (EEPROM), and a flash memory. A RAM is a volatile memory which loses data when power is interrupted. Examples of the RAM include a dynamic RAM (DRAM) and a static RAM (SRAM). In addition, a novel semiconductor memory device in which a DRAM capacitor is replaced with a nonvolatile material has been introduced. Examples of such a novel semiconductor memory device include a ferroelectric RAM (FRAM) using a ferroelectric capacitor, and a magnetic RAM (MRAM) using a tunneling magnetoresistive (TMR) film.

A memory block having an OTP memory cell which can provide a one-time programming mode is widely used to store trimming information, security ID, chip ID, and/or calibration data of an integrated circuit, or store redundancy information of a main memory. Since a system using an integrated circuit becomes more sophisticated and complicated in operation and requires a high-capacity memory device, there is a need to further increase an operating speed of an OTP memory cell block.

SUMMARY OF THE INVENTION

An embodiment of the present invention is directed to a semiconductor device including an OTP memory cell which can access data at a high speed.

In accordance with an embodiment of the present invention, a semiconductor device with a one-time programmable (OTP) memory cell includes: a first MOS transistor having a first gate terminal connected to a first line, a first terminal of the first MOS transistor connected to a first node, and a second terminal of the first MOS transistor connected to a bias voltage line; a second MOS transistor having a second gate terminal connected to a second line, a first terminal of the second MOS transistor connected to the first node, and a second terminal of the second MOS transistor connected to a bias voltage line; and a third MOS transistor having a gate terminal connected to a word line, and a first terminal of the third MOS transistor connected to the first node, and a second terminal of the third MOS transistor connected to a ground terminal.

In accordance with another embodiment of the present invention, a semiconductor device with a plurality of OTP memory cells includes: a plurality of bias voltage lines connected to first and second MOS transistors in each corresponding OTP memory cell; a plurality of lines arranged so that a corresponding pair of the plurality of lines are connected to the first and the second MOS transistors in each corresponding OTP memory cell; a plurality of word lines connected to a third MOS transistor in each corresponding OTP memory cell; a plurality of line sense amplifiers configured to sense and amplify data signals provided to the plurality of lines; and wherein each OTP memory cell includes: the first MOS transistor having a first gate terminal connected to a first line of the corresponding pair of lines, a first terminal of the first MOS transistor connected to a first node, and a second terminal of the first MOS transistor connected to a corresponding bias voltage line; the second MOS transistor having a second gate terminal connected to a second line of the corresponding pair of bit lines, a first terminal of the second MOS transistor connected to the first node, and a second terminal of the second MOS transistor connected to the corresponding bias voltage line connected to the first MOS transistor; and the third MOS transistor having a gate terminal connected to a corresponding word line, and a first terminal of the third MOS transistor connected to the first node, and the second terminal of the third MOS transistor connected to ground.

DESCRIPTION OF SPECIFIC EMBODIMENTS

Figure 1:
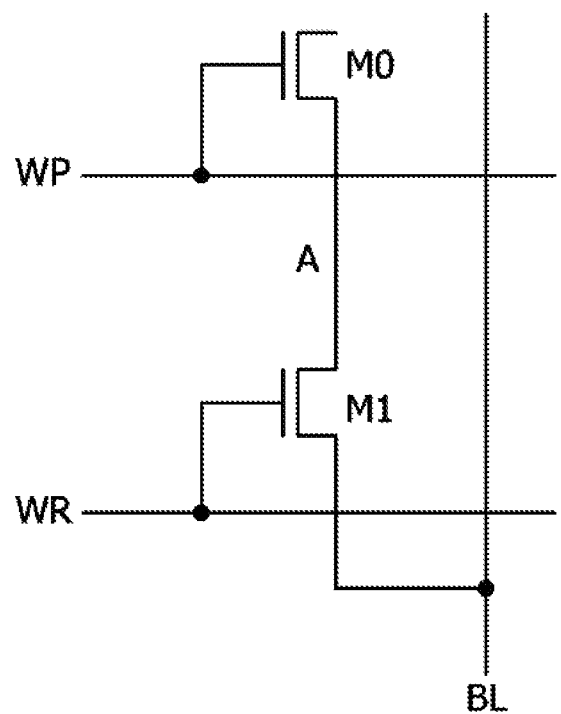
FIG. 1 is a circuit diagram of an OTP memory cell, which is presented for explaining the present invention.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The present invention relates to an OTP memory cell which can electrically program data only one time. The programmed data is retained even when power is interrupted.

FIG. 1 is a circuit diagram of an OTP memory cell, which is presented for explaining the present invention.

As illustrated in FIG. 1, the OTP memory cell includes a first MOS transistor M0 and a second MOS transistor M1. A gate terminal of the first MOS transistor M0 is connected to a first word line WP, and a gate terminal of the second MOS transistor M1 is connected to a second word line WR. A first terminal of the first MOS transistor M0 is in a floating state and a second terminal of the first MOS transistor M0 is connected to a node A. A first terminal of the second MOS transistor M1 is also connected to the node A. A second terminal of the second MOS transistor M1 is connected to a line BL. For reference, the first terminal of the first MOS transistor M0 is floated because it does not influence the data storing and outputting of the OTP memory cell.

In general, the gate terminal of the MOS transistor is formed by stacking a conductive film on an insulation film. In a programming mode, the insulation film of the first MOS transistor M0 is broken down. The second MOS transistor M1 acts as a switch for selecting the OTP memory cell.

Figure 2:
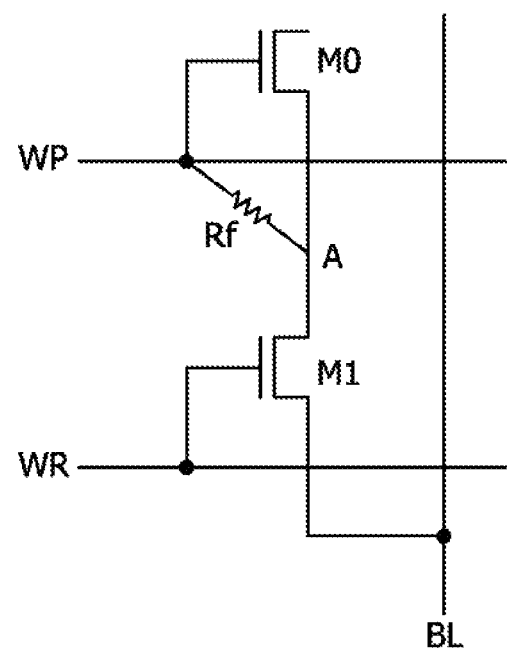
FIG. 2 is a circuit diagram of the programmed OTP memory cell illustrated in FIG. 1.

FIG. 2 is a circuit diagram of the programmed OTP memory cell illustrated in FIG. 1. The programming mode of the OTP memory cell illustrated in FIG. 1 will be described below with reference to FIG. 2. First, a ground voltage is applied to bodies of the first and second MOS transistors M0 and M1.

A high voltage VPP is applied to the first word line WP. A first voltage is applied to the second word line WR. The first voltage is a voltage lower than the high voltage VPP. For example, the first voltage may have a half level of the high voltage VPP, that is, VPP/2. In addition, the ground voltage is applied to the bit line BL. The high voltage VPP is a voltage generated using an external power supply voltage. The high voltage VPP has enough voltage to break down the insulation film constituting a gate pattern of the first word line WP. For example, when the power supply voltage is 1.2 V, the high voltage VPP may be 6 V.

Since the first voltage VPP/2 is applied to the gate terminal of the second MOS transistor M1, the second MOS transistor M1 is turned on, so that the ground voltage is applied to the node A. Since the high voltage VPP is applied to the gate terminal of the first MOS transistor M0 and the ground voltage is applied to the node A, the insulation film constituting the gate pattern of the first word line WP is broken down. A current path is formed between the gate terminal of the first word line WP and the node A, and the current path is denoted by a resistor Rf. In order to reliably break down the insulation film constituting the gate pattern of the first MOS transistor M0 in the programming mode, the first MOS transistor M0 is configured with a MOS transistor in which an insulation film of a gate pattern is relatively thin. In addition, the reliability of the programming can be improved when the high voltage VPP is higher by 0-50% than a breakdown voltage of the insulation film constituting the gate pattern of the first MOS transistor M0.

In a read mode, the power supply voltage VDD is applied to the first word line WP, and the power supply voltage VDD is also applied to the second word line WR. The bit line BL is precharged to the ground voltage. In this case, when the insulation film constituting the gate pattern of the first MOS transistor M0 has been broken down, the voltage level of the bit line BL rises. A bit line sense amplifier (not shown) senses the voltage level of the bit line BL. The bit line sense amplifier compares a reference voltage level with the voltage level of the bit line BL, and senses whether the voltage level of the bit line BL is higher than the reference voltage level.

If the insulation film constituting the gate pattern of the first MOS transistor M0 has not been broken down, the voltage level of the bit line BL does not rise and maintains the precharge voltage. In the read mode, the bit line sense amplifier connected to the bit line BL senses the voltage applied to the bit line BL and discriminates data "0" or data "1".

The data access time for the above-described OTP memory cell is about 200 ns. Accordingly, depending on the system clock rate, several clock cycles of wait time may be needed to access data stored in the OTP memory cell. In order to read data from the OTP memory cell in real time, a buffer memory such as an SRAM or a register may additionally be required.

In the structure of the OTP memory cell illustrated in FIG. 1, the gate insulation film may not be consistent when the OTP memory cell is programmed. When the OTP memory cell is programmed, the ground voltage is applied to the body of the first MOS transistor M0, the first terminal of the first MOS transistor M0 is floated, and the ground voltage is applied to the second terminal of the first MOS transistor M0, i.e., the node A. Therefore, it is likely that a region of the gate insulation film near to the node A will be broken down. However, in some cases, the center region of the gate insulation film may be broken down. Since the broken position of the gate insulation film is random, the resistance of the resistor Rf illustrated in FIG. 2 may not be strictly predictable. Hence, in order for stable data access when the above-described OTP memory cell is used, the data access timing should be designed assuming a case in which the resistance of the resistor Rf illustrated in FIG. 2 is high.

Also, in the case of a single-ended output terminal, the reference voltage needs to be used for sensing data because the bit line sense amplifier connected to the bit line senses the voltage applied to the bit line with respect to the reference voltage. In addition, the bit line sense amplifier fundamentally has a sensing margin. Therefore, the bit line sense amplifier can sense the programmed data when a current flowing through the resistor Rf is applied to the bit line and the voltage applied to the bit line is higher than a voltage of "the sensing margin of the bit line sense amplifier+the reference voltage".

As described above, the OTP memory cell illustrated in FIG. 1 has many limits that tend to increase data access time. To overcome these limits, there is proposed a semiconductor device including an OTP memory cell which can access data at a high speed.

Figure 3:
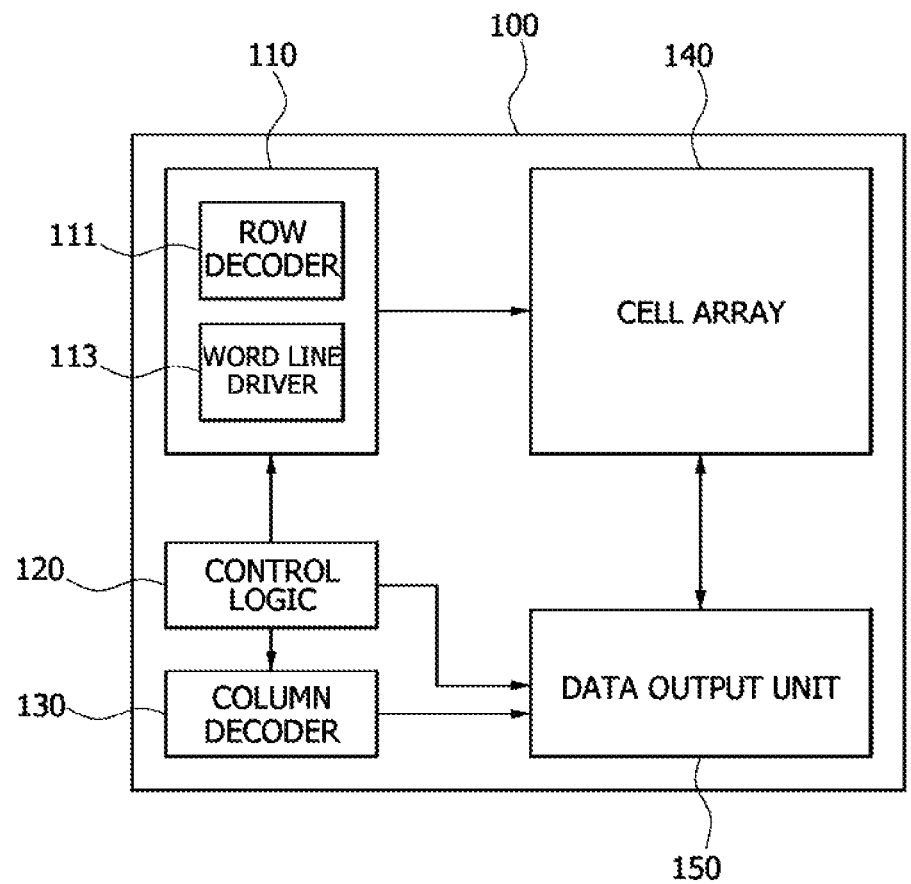
FIG. 3 is a block diagram of a semiconductor device including an OTP memory cell in accordance with an embodiment of the present invention.

FIG. 3 is a block diagram of a semiconductor device including an OTP memory cell in accordance with an embodiment of the present invention.

As illustrated in FIG. 3, a semiconductor device 100 with an OTP memory cell includes an address control unit 110, a control logic 120, a column decoder 130, a cell array 140, and a data output unit 150. The address control unit 110 includes a row decoder 111 and a word line driver 113. In the address control unit 110, the row decoder 111 decodes a row address, and the word line driver 113 drives a word line selected according to a decoding result of the row decoder 111. The control logic 120 controls the address control unit 110, the data output unit 150, and the column decoder 130 according to an external command. The column decoder 130 decodes a column address. The data output unit 150 outputs a signal selected by the column address among a plurality of signals provided from the cell array 140. The cell array 140 includes a plurality of OTP memory cells.

The semiconductor device illustrated in FIG. 3 may be configured with a single independent device, or may be included in another memory device or semiconductor device. For example, the semiconductor device may store trimming information, security ID, chip ID, and/or calibration data of an integrated circuit, or may store redundancy information of a main memory.

Figure 4:
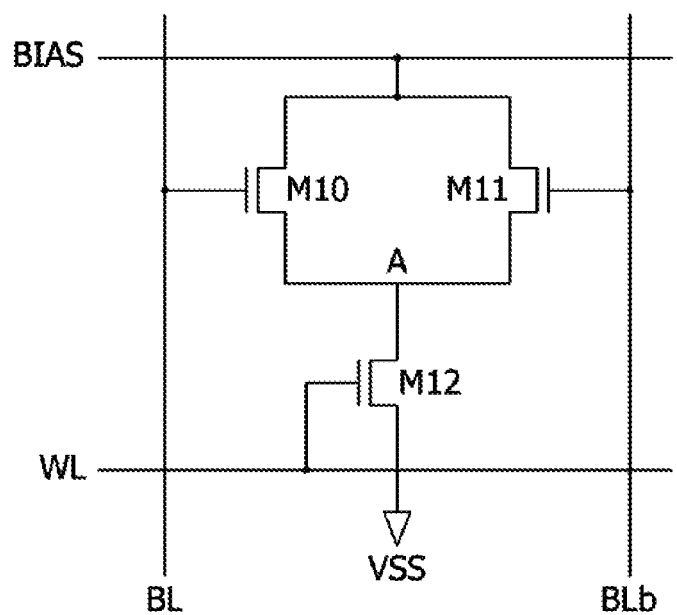
FIG. 4 is a circuit diagram of an OTP memory cell in accordance with an embodiment of the present invention.
Figure 5:
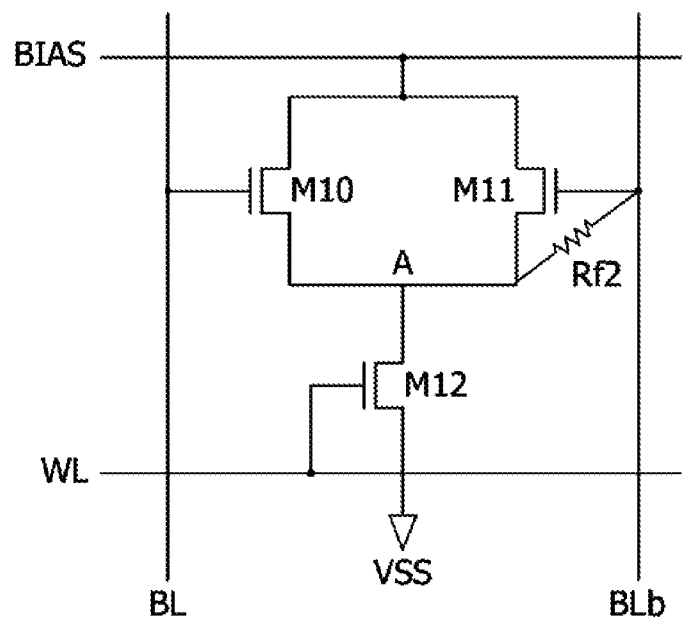
FIG. 5 is a circuit diagram of the programmed OTP memory cell illustrated in FIG. 4.

FIG. 4 is a circuit diagram of an OTP memory cell in accordance with an embodiment of the present invention. FIG. 5 is a circuit diagram of the programmed OTP memory cell illustrated in FIG. 4.

Referring to FIG. 4, an OTP memory cell in accordance with an embodiment of the present invention includes a first MOS transistor M10, a second MOS transistor M11, and a third MOS transistor M12. The first MOS transistor M10 has a first gate terminal connected to a first bit line BL, and a first terminal connected to a node A. The second MOS transistor M11 has a second gate terminal connected to a second bit line BLb, and a first terminal connected to the node A. Second terminals of the first and second MOS transistors M10 and M11 are connected to a bias voltage line BIAS. The third MOS transistor M12 has a gate terminal connected to a word line WL, and a first terminal connected to the node A. Thus, a current path can be formed so that a current flows to the resistance node A through the first gate terminal or the second gate terminal. In addition, a second terminal of the third MOS transistor M12 is connected to a ground terminal. A ground voltage VSS is applied to bodies of the first and third MOS transistors M10 and M12.

The first and second MOS transistors M10 and M11 serve to store data through the breakdown of the gate insulation film, and the third MOS transistor M12 serves to select the OTP memory cell.

Referring to FIG. 5, the OTP memory cell in accordance with an embodiment of the present invention is characterized in that the insulation film of the first gate terminal or the second gate terminal is broken down in the programming mode (see Rf2).

Figure 6:
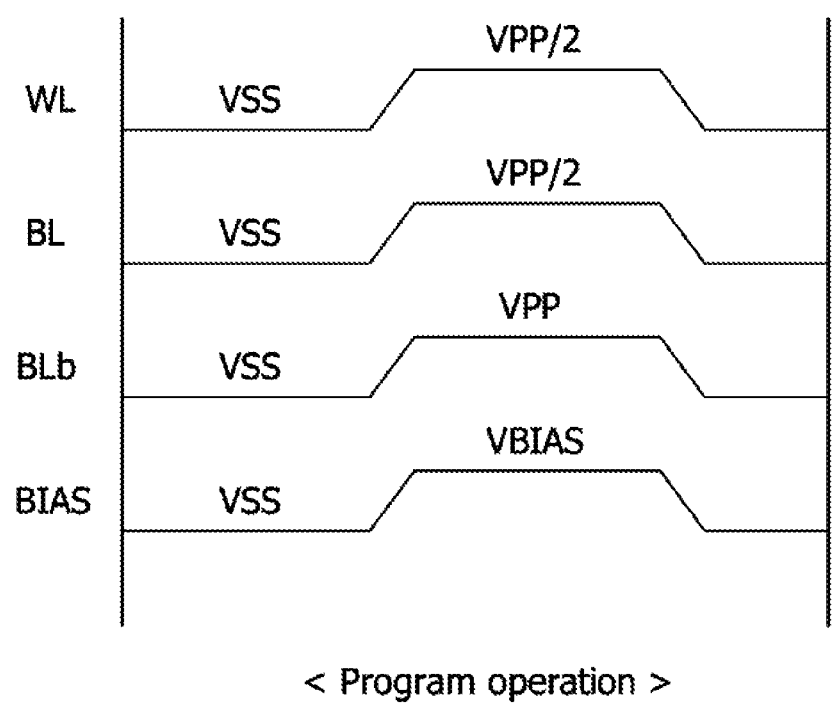
FIG. 6 is a diagram of voltages provided in a programming mode of the OTP memory cell illustrated in FIG. 4.

FIG. 6 is a diagram of voltages provided in the programming mode of the OTP memory cell illustrated in FIG. 4.

Referring to FIGS. 5 & 6, in the programming mode, a high voltage VPP higher than a driving voltage used to read data is applied to the second bit line BLb in order to break down the gate insulation film of the second MOS transistor M11, and a turn-on voltage, which may be, for example, VPP/2, is applied to the word line WL and the first bit line BL in order to turn on the third MOS transistor M12. The gate pattern is usually formed by stacking an insulation film and a conductive film. The gate insulation film refers to an insulation film disposed under the conductive film of the gate pattern. Therefore, the insulation film of the second MOS transistor M11 is broken down because of the high voltage VPP at the gate insulation film of the second MOS transistor M11. However, the insulation film of the first MOS transistor M10 is not broken down because the turn-on voltage VPP/2 at the gate insulation film of the first MOS transistor M10 is not sufficient voltage.

A bias voltage having a preset level is applied to the second terminals of the first and second MOS transistors M10 and M11 through a bias voltage line BIAS in order to generate hot carriers in channel regions of the first and second MOS transistors M10 and M11. The bias voltage has a lower level than that of the high voltage VPP. For example, when the driving voltage is 1.2 V, the high voltage VPP may be 6 V and the bias voltage may be in the range of 1 V to 2 V. There is no limit to the level of the high voltage VPP as long as it is enough to break down the gate insulation films of the first and second MOS transistors M10 and M11. In order to provide an operation margin, a voltage higher by, for example, 5-10% than a breakdown voltage of the gate insulation film may be used as VPP.

Figure 7:
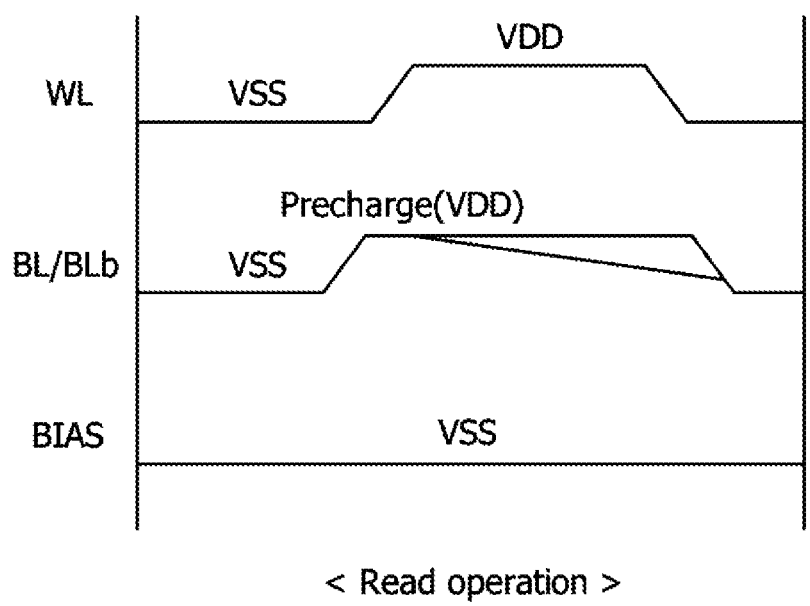
FIG. 7 is a diagram of voltages provided in a read mode of the OTP memory cell illustrated in FIG. 4.

FIG. 7 is a diagram of voltages provided in a read mode of the OTP memory cell illustrated in FIG. 4.

Referring to FIGS. 5 and 7, in the read mode, the ground voltage VSS is applied to the bias voltage line BIAS, and the driving voltage VDD is applied to the word line WL. In addition, the first and second bit lines BL and BLb are precharged to the driving voltage VDD. When the gate insulation film of the second MOS transistor M11 is broken down, a current path is formed between the gat terminal of the second MOS transistor M11 and the resistance node A. Therefore, the voltage level of the second bit line BLb gradually drops from the driving voltage VDD. The bit line sense amplifier (not shown) senses a voltage difference between the two bit lines BL and BLb, and outputs a corresponding data signal. There is no limit to implementation of the bit line sense amplifier for sensing the voltage difference between the two bit lines BL and BLb as long as it can sense a voltage difference between two signals.

In order to read data stored in the OTP memory cell in the read mode, the bit lines BL and BLb are precharged to the driving voltages VDD and floated. Then, the voltage applied to the word line WL is raised from 0 V to the driving voltage VDD.

The bit lines BL and BLb may also be precharged to a lower voltage, for example, half of the driving voltage, i.e., VDD/2, and floated. Then, 0 V is applied to the word line WL and the bias voltage is raised from 0 V to the driving voltage VDD.

As described above, the OTP memory cell in accordance with the embodiment of the present invention has a double-ended structure. When the voltage difference corresponding to the sensing margin of the bit line sense amplifier occurs between the bit lines BL and BLb, the bit line sense amplifier senses the corresponding voltage difference and outputs a signal corresponding to the data stored in the OTP memory cell. For example, when the gate insulation film of the second MOS transistor M12 is broken down and thus the voltage of the bit line BLb is reduced, the corresponding data is read as data "0". When the gate insulation film of the first MOS transistor M11 is broken down and thus the voltage of the bit line BL is reduced, the corresponding data is read as data "1". In the OTP memory cell in accordance with an embodiment of the present invention, since data is read by sensing the voltage difference between the two bit lines BL and BLb, data can be read more rapidly than the OTP memory cell illustrated in FIG. 1.

In addition, in the programming mode, the OTP memory cell in accordance with an embodiment of the present invention is supplied with the bias voltage through the bias voltage line BIAS. Due to the bias voltage and the high voltage applied to the gate terminal, a current flows from the drain terminal of the first or second MOS transistor, as appropriate, to the node A, and hot carriers are generated so that electrons are injected into the corresponding gate. The injected high-energy electrons generate holes having high energy at the gate. The generated holes tunnel through the node A. The holes help the breakdown of the gate insulation film. Due to the holes, the breakdown region of the gate insulation film is fixed to the region contacting the node A. Since the breakdown region of the gate insulation film is fixed to the region contacting the node A, the resistance of the current path (see Rf) occurring between the gate terminal and the node A is reduced. Thus, the voltage drop speed of the bit line BLb in the read mode increases, thereby reducing the data access time.

As described above, the access time of the OTP memory cell in accordance with the embodiment of the present invention is remarkably reduced, as compared to the case of FIG. 1. Therefore, when the OTP memory cell in accordance with the embodiment of the present invention is used in the system, no additional buffer memory is required. Consequently, the operation efficiency of the system can be increased.

Figure 8:
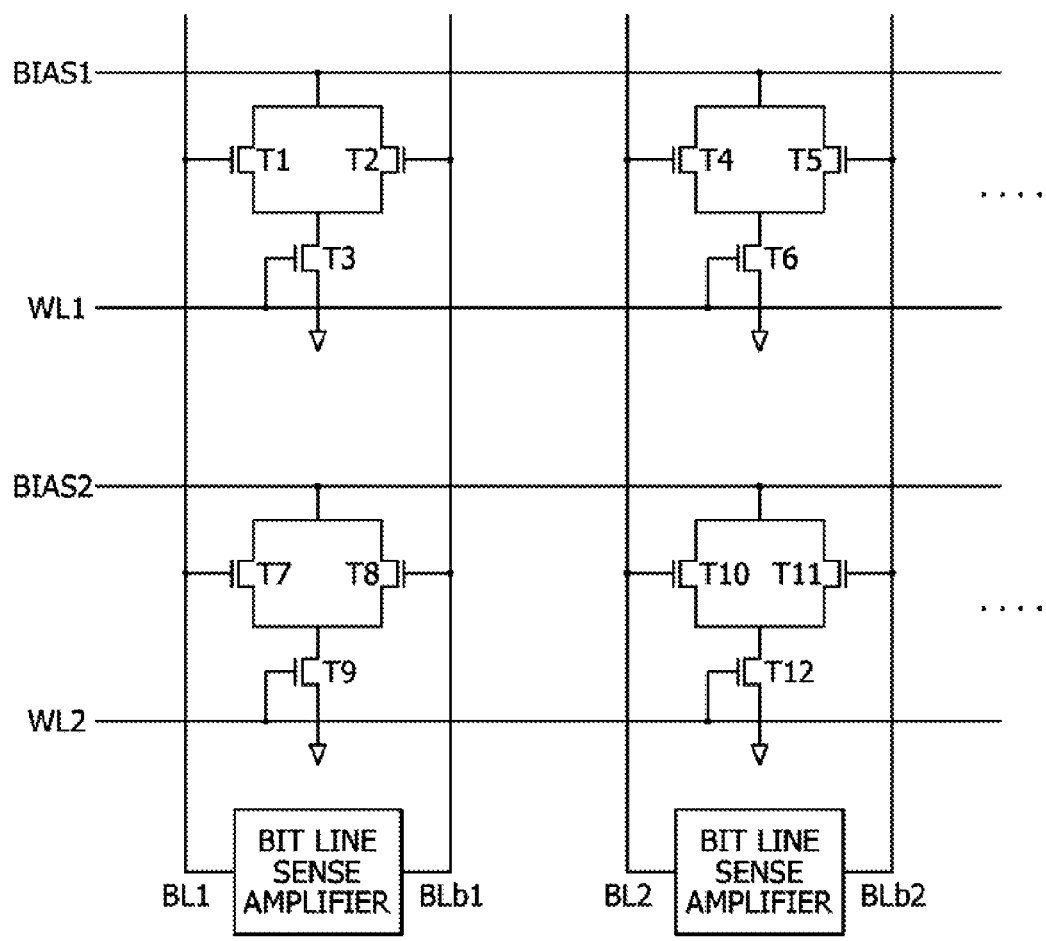
FIG. 8 is a circuit diagram of a cell array of a semiconductor device including the OTP memory cell illustrated in FIG. 4.

FIG. 8 is a circuit diagram of a cell array of a semiconductor device including the OTP memory cells illustrated in FIG.

4. Specifically, FIG. 8 illustrates a memory cell array in which the OTP memory cells illustrated in FIG. 4 are arranged in a matrix form.

As illustrated in FIG. 8, a plurality of word lines WL1 and WL2 are arranged, and a plurality of bias voltage lines BIAS1 and BIAS2 are arranged in correspondence to the word lines WL1 and WL2. A plurality of bit lines BL1, BLb1, BL2, and BLb2 are arranged so that they are paired to each other and crossed to the word lines WL1 and WL2. A bit line sense amplifier is connected to each bit line pair. The OTP memory cell illustrated in FIG. 4 is arranged at each position where the bit line and the word line are crossed.

In accordance with the exemplary embodiments of the present invention, it is possible to easily implement an OTP memory cell which can access data at a high speed.

While the present invention has been described with respect to the specific embodiments, it will be apparent to those skilled in the art that various changes and modifications may be made without departing from the spirit and scope of the invention as defined in the following claims.

What is claimed is:

1. A semiconductor device with a one-time programmable (OTP) memory cell, comprising:
   a first MOS transistor having a first gate terminal connected to a first line, a first terminal of the first MOS transistor connected to a first node, and a second terminal of the first MOS transistor connected to a bias voltage line;
   a second MOS transistor having a second gate terminal connected to a second line, a first terminal of the second MOS transistor connected to the first node, and a second terminal of the second MOS transistor connected to a bias voltage line; and
   a third MOS transistor having a third gate terminal connected to a third line, a first terminal of the third MOS transistor connected to the first node, and a second terminal of the third MOS transistor connected to a ground terminal,
   wherein a current path is formed in a programming mode by breaking down an insulation film of one of the first gate terminal and the second gate terminal so that a current flows through one of the first gate terminal and the second gate terminal to the first node.

2. The semiconductor device of claim 1, wherein, in the programming mode, a high voltage higher than a driving voltage is applied to the first bit line to break down the first gate terminal.

3. The semiconductor device of claim 2, wherein a turn-on voltage is applied to the third line in order to turn on the third MOS transistors.

4. The semiconductor device of claim 3, wherein a bias voltage having a preset level is applied to the bias voltage line to generate hot carriers in channel regions of the first and second MOS transistors.

5. The semiconductor device of claim 4, wherein the bias voltage is lower than the high voltage.

6. The semiconductor device of claim 3, wherein the turn-on voltage has a substantially half level of the high voltage.

7. The semiconductor device of claim 1, wherein, in a read mode, a ground voltage is applied to the bias voltage line, a driving voltage is applied to the three line, and the first and second lines are precharged to the driving voltage.

8. The semiconductor device of claim 1, wherein, in a read mode, the first and second lines are precharged to a driving voltage, and the driving voltage is applied to the three line.

9. The semiconductor device of claim 1, wherein, in a read mode, the first and second lines are precharged to a half level of a driving voltage, a voltage representing a logic low is applied to the three line, and the driving voltage is applied as the bias voltage.

10. The semiconductor device of claim 1, further comprising a line sense amplifier configured to sense a voltage difference between the first line and the second line.

11. A semiconductor device with a plurality of OTP memory cells, comprising:
    a plurality of bias voltage lines connected to first and second MOS transistors in each corresponding OTP memory cell;
    a plurality of lines arranged so that a corresponding pair of the plurality of lines are connected to the first and the second MOS transistors in each corresponding OTP memory cell;
    a plurality of three lines connected to a third MOS transistor in each corresponding OTP memory cell;
    a plurality of line sense amplifiers configured to sense and amplify data signals provided to the plurality of lines; and
    wherein each OTP memory cell comprises:
    the first MOS transistor having a first gate terminal connected to a first line of the corresponding pair of lines, a first terminal of the first MOS transistor connected to a first node, and a second terminal of the first MOS transistor connected to a corresponding bias voltage line;
    the second MOS transistor having a second gate terminal connected to a second line of the corresponding pair of lines, a first terminal of the second MOS transistor connected to the first node, and a second terminal of the second MOS transistor connected to the corresponding bias voltage line connected to the first MOS transistor; and
    the third MOS transistor having a gate terminal connected to a corresponding three line, and a first terminal of the third MOS transistor connected to the first node, and the second terminal of the third MOS transistor connected to ground.

12. The semiconductor device of claim 11, wherein a current path is formed in a programming mode by breaking down an insulation film of one of the first gate terminal and the second gate terminal so that a current flows through one of the first gate terminal and the second gate terminal to the first node.

13. The semiconductor device of claim 12, wherein, in the programming mode, a high voltage higher than a driving voltage is applied to first line to break down the insulation film of the first gate terminal.

14. The semiconductor device of claim 13, wherein a turn-on voltage is applied to the corresponding three line in order to turn on the third MOS transistors.

15. The semiconductor device of claim 14, wherein the turn-on voltage has a substantially half level of the high voltage.

16. The semiconductor device of claim 12, wherein a bias voltage having a preset level is applied to one of the plurality of bias voltage lines corresponding to the OTP memory cell in order to generate hot carriers in channel regions of the first and second MOS transistors.

17. The semiconductor device of claim 16, wherein the bias voltage is lower than the high voltage.

18. The semiconductor device of claim 11, wherein, in a read mode, a ground voltage is applied to the bias voltage line, the driving voltage is applied to the three line, and the first and second lines are precharged to the driving voltage.

19. The semiconductor device of claim 11, wherein, in a read mode for an OTP memory cell, the corresponding pair of lines is precharged to a driving voltage, and a driving voltage is applied to the corresponding three line.

20. The semiconductor device of claim 11, wherein, in a read mode, the corresponding pair of lines are precharged to a half level of a driving voltage, a voltage representing a logic low is applied to the corresponding three line, and the driving voltage is applied to a corresponding bias voltage line.

* * * * *